(12) United States Patent
Buyanovskiy

(10) Patent No.: US 12,293,308 B2
(45) Date of Patent: May 6, 2025

(54) BIT PREDICTION METHOD AND SYSTEM USING A STATISTICAL MODEL

(71) Applicant: FOVIA, INC., Palo Alto, CA (US)

(72) Inventor: Georgiy Buyanovskiy, Palo Alto, CA (US)

(73) Assignee: FOVIA, INC., Palo Alto, CA (US)

( * ) Notice: Subject to any disclaimer, the term of this patent is extended or adjusted under 35 U.S.C. 154(b) by 1069 days.

(21) Appl. No.: 16/153,382

(22) Filed: Oct. 5, 2018

(65) Prior Publication Data

US 2019/0108455 A1    Apr. 11, 2019

Related U.S. Application Data

(60) Provisional application No. 62/569,894, filed on Oct. 9, 2017.

(51) Int. Cl.
| | |
|---|---|
| *G06N 7/01* | (2023.01) |
| *G06F 16/22* | (2019.01) |
| *G06F 16/31* | (2019.01) |
| *H03M 7/30* | (2006.01) |
| *G06F 30/20* | (2020.01) |

(52) U.S. Cl.
CPC .......... *G06N 7/01* (2023.01); *G06F 16/2246* (2019.01); *G06F 16/31* (2019.01); *H03M 7/3068* (2013.01); *G06F 30/20* (2020.01)

(58) Field of Classification Search
None
See application file for complete search history.

(56) References Cited

U.S. PATENT DOCUMENTS

| | | | |
|---|---|---|---|
| 7,028,042 B2 | 4/2006 | Rissanen | |
| 2002/0034334 A1 | 3/2002 | Goertzen | |
| 2005/0168240 A1* | 8/2005 | Martin | H03M 7/30 |
| | | | 326/46 |

(Continued)

FOREIGN PATENT DOCUMENTS

| | | | |
|---|---|---|---|
| EP | 1063827 A2 * | 12/2000 | ....... H04L 29/12009 |
| EP | 3136607 A1 * | 3/2017 | |

OTHER PUBLICATIONS

International Search Report received for PCT Patent Application No. PCT/US2018/054209, mailed on Dec. 4, 2018, 12 pages.

(Continued)

*Primary Examiner* — Richa Sonifrank
(74) *Attorney, Agent, or Firm* — DLA Piper LLP (US)

(57) ABSTRACT

Methods and apparatus for bit prediction and data compression are provided. In the bit prediction method and apparatus, a specific Suffix Trie is used to maintain a statistical model to predict the next bit in a bit-stream. The statistic model provides the probability for each next or following bit in the bit stream, where an entropy encoder/decoder further encodes/decodes the predicted bit. The algorithm simplicity and its high performance relies on the combination of the specific method of Suffix Trie construction and growing, and the specific way to compute, update and propagate the probability across Suffix Trie nodes. The specific and particular method to grow the Suffix Trie in conjunction with the specific method to compute, update, and propagate the probability across Suffix Trie nodes are key aspects and subject matter of the present invention.

14 Claims, 14 Drawing Sheets

(56) References Cited

U.S. PATENT DOCUMENTS

| | | | |
|---|---|---|---|
| 2008/0270055 A1* | 10/2008 | Rozell | G06G 7/26 |
| | | | 702/71 |
| 2009/0096645 A1 | 4/2009 | Yasuda et al. | |
| 2010/0014581 A1* | 1/2010 | Bossen | H03M 7/4018 |
| | | | 375/E7.026 |
| 2012/0159180 A1* | 6/2012 | Chase | H04L 9/0869 |
| | | | 713/184 |
| 2018/0176576 A1* | 6/2018 | Rippel | G06N 3/08 |
| 2019/0068994 A1* | 2/2019 | He | H04N 19/13 |

OTHER PUBLICATIONS

Ukkonen, Esko, "On-line Construction of Suffix Trees", Algorithmica, vol. 14, No. 3, 1995, 18 pages.
International Preliminary Report on Patentability received for PCT Patent Application No. PCT/US2018/054209, mailed on Apr. 23, 2020, 10 pages.

\* cited by examiner

| INPUT | C | S | C' | S' |
|---|---|---|---|---|
| 0 | ∞ | ∞ | 0 | 0 |
| 00 | 0 | 0 | 0 | 00 |
| 001 | 0 | 00 | 1 | 01 |
| 0010 | 1 | 01 | 0 | 10 |
| 00101 | 0 | 10 | 01 | 101 |
| 001010 | 01 | 101 | 10 | 010 |
| 0010101 | 10 | 010 | 101 | 0101 |
| 00101011 | 101 | 0101 | 1 | 1011 |
| 001010111 | 1 | 1011 | 1 | 11 |
| 0010101110 | 1 | 11 | 10 | 110 |

FIG. 4

BIT PREDICTION METHOD AND SYSTEM USING A STATISTICAL MODEL

CROSS-REFERENCE TO RELATED APPLICATIONS

This application claims priority to U.S. Provisional Patent Application 62/569,894, filed Oct. 9, 2017, entitled "BIT PREDICTION METHOD AND SYSTEM USING A STATISTICAL MODEL", the content of which is hereby incorporated in its entirety.

FIELD

The present disclosure relates generally to bit prediction and data compression, and more specifically to techniques for maintaining a statistical model to predict the next bit in a bit stream.

BACKGROUND

In general, data tree structures, such as probability trees, binary trees, or tries, may be used for prediction and compression applications. For example, prediction of an unknown symbol in a series of symbols may be accomplished by a contextual statistical model. Such predictions are basis for many statistical compression methods, such as partial matching (PPM), dynamic Markov compression (DMC), context tree weighting (CTW), and probabilistic suffix tree (PST) methods. One important structure relevant to this invention is STrie(T) [Ukkonen, E., "On-line construction of suffix trees," *Algorithmica*, 14 (3): 249-260 (1995).]

However, depending on the type of input data stream, significant research and development must be performed in order to achieve bit prediction at a high performance level. To achieve efficient implementation of bit prediction, a large number of intricate and performance-critical details within a bit prediction model must be adjusted and optimized. Even if such performance can be realized, the fine-tuning required may involve a significant amount of time and effort. As a result, the algorithms are often "hardwired" to achieve top performance for a particular type of data. Moreover, existing algorithms for increasing performance in bit prediction are complex and nonflexible. Thus, a simple and high performance technique for bit prediction is desired, specifically, a technique which is trainable for different types of data. Particularly advantageous to the present invention is the combination of simplicity, performance, and flexibility as discussed herein.

SUMMARY

Systems and processes for bit prediction and representing a statistical model are provided. A data bit is received, and a binary event probability is determined for a plurality of nodes. The bit is entropy coded based on a composite probability, where the binary event probabilities are adjusted and updated. If a current node has reference to a node corresponding to the bit value, a first context node is assigned as a new current node. If not, a new node is provided, and a reference of the current node is assigned to the new node. One or more suffix links are traversed to identify a node having reference corresponding to the bit value, where a suffix link is provided between the new node and identified node. A probability is copied from the identified node to the new node, where the identified node is assigned as the current node.

BRIEF DESCRIPTION OF THE DRAWINGS

FIG. 4 illustrates a numerical example of the probability updating procedure.

DETAILED DESCRIPTION

Figure 1:
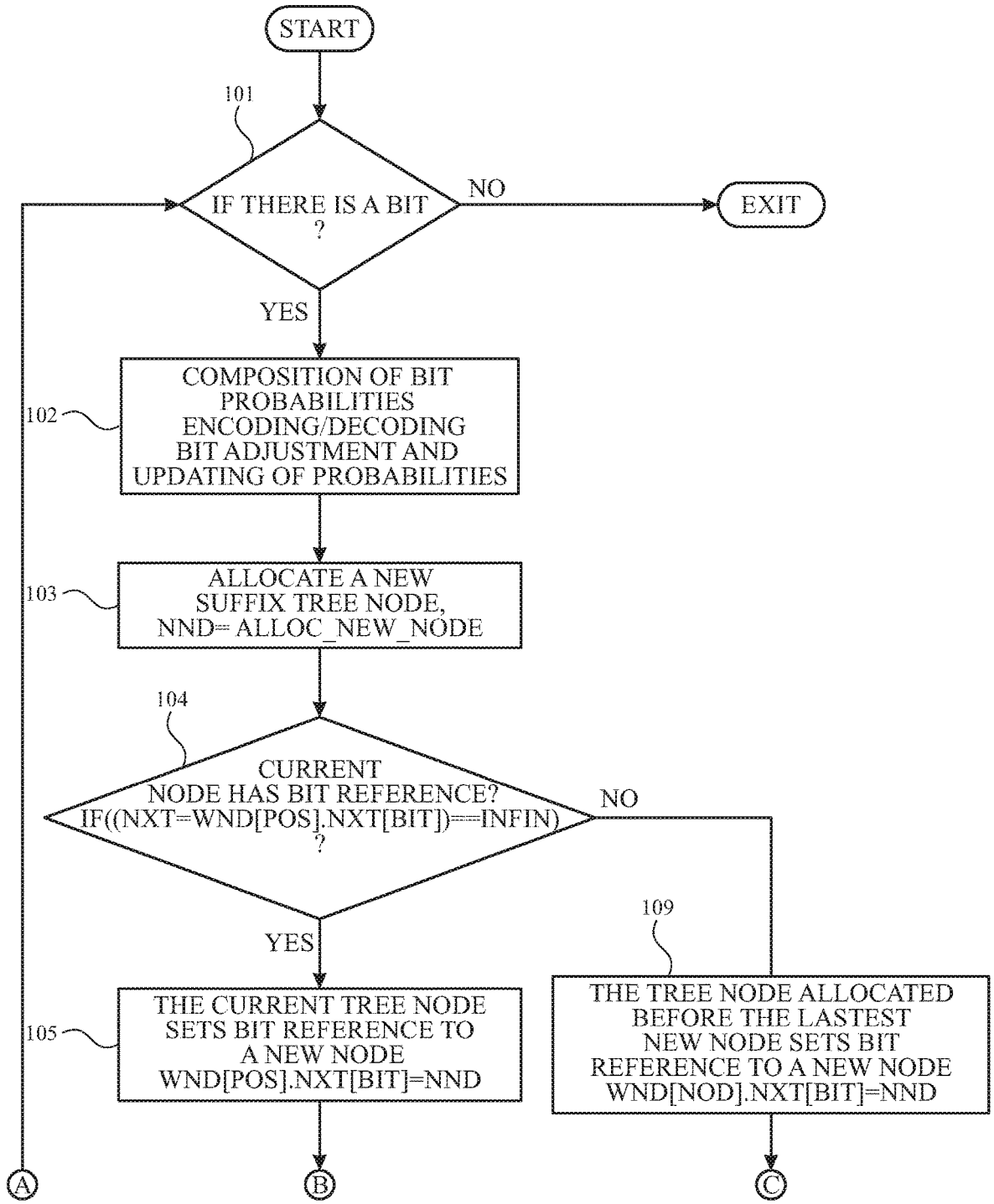
FIG. 1 illustrates an exemplary process flow for predicting the next bit in a bit stream.
Figure 1:
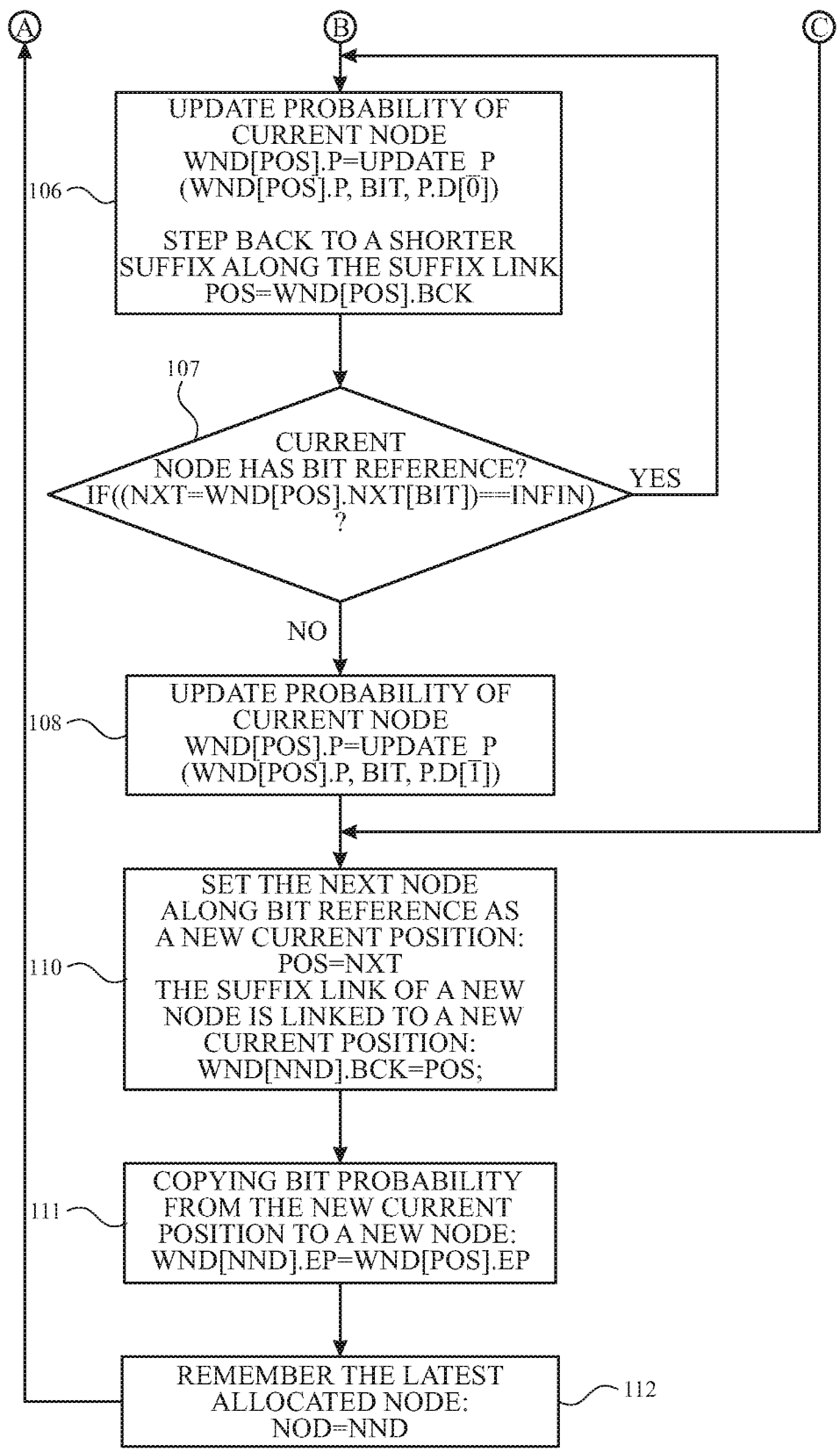

In the following description of examples, reference is made to the accompanying drawings in which it is shown by way of illustration specific examples that can be practiced. It is to be understood that other examples can be used and structural changes can be made without departing from the scope of the various examples.

In general, the present invention is directed to computing the probability of a bit value for each incoming bit in a bit stream by means of a statistical model. In particular, the present invention relates to PPM methods which use the prediction of single symbol in a symbol stream. For example, the PAQ family is one well-known bit-oriented PPM method. The statistic model used may provide the probability of each next bit in a bit stream. An entropy encoder/decoder may further encode/decode the predicted bit. The present invention may utilize one or more data tree structures, such as a specific version of a Suffix-Trie. A trie may refer to an efficient data tree structure that uses specific attributes of tree nodes to process information and answer queries. In some embodiments, the statistical model discussed herein is represented by a specific Suffix-Trie structure, and a corresponding method to compute, propagate, and update the probability for each Suffix-Trie node across the Suffix-Trie. For example, reference to one version of a Suffix-Trie may be referred to as STrie(T), with space complexity $O(n*n)$, which can be found in reference Ukkonen, E., "On-line construction of suffix trees," *Algorithmica*, 14 (3): 249-260 (1995), incorporated herein by reference in its entirety. In some embodiments, the present invention utilizes another version of a Suffix-Trie with space complexity $O(n)$.

In particular, the present invention utilizes a specific and efficient method of Suffix-Trie expansion, which is realized by software code written in the C++ programming language. In some embodiments, the present invention is realized by only 11 lines of C-code to define both (i) the encoding and decoding stages of Suffix-Trie growing and (ii) probabilities updating and propagating. The simplicity, high performance, and compactness of the algorithm relies on the combination of the specific version of the Suffix-Trie, and of computing, updating, and propagating probabilities across Suffix-Trie nodes.

The general logic of Suffix-Trie operation in the context of the present invention is now described. In some embodiments, each Suffix-Trie node may contain a single number representing the probability of a data bit value (e.g., "1" or "0"). In particular, two references (or branches) corresponding to "1" or "0" events may be utilized. These references may, for example, extend down the Suffix-Trie toward tree leaves. A current Suffix-Trie node represents a current context-suffix, which indicates a latest context of certain length. For example, a latest context of certain length may be representative of a chain of 0/1 events preceding a current encoder/decoder position. Furthermore, for example, each node in the Suffix-Trie includes a link to a shorter context-suffix, or a suffix-link. A suffix-link may point to a tree node with a similar but shorter context. In some embodiments, each reference within the Suffix-Trie may point to a node with a longer context-suffix, since there are two possible ways of expanding a current context-suffix by the addition of either a "0" or "1" to the front of the current context-suffix. An encoder/decoder may move from one tree node to another along the references once such references are created. When there are no further references to a longer context-suffix, the encoder/decoder may move back along suffix-links to shorter contexts until the encoder/decoder arrives at a node with an available "0" or "1" reference to a longer context.

In some embodiments, each node in the Suffix-Trie may have a probability of whether a "0" or "1" event will occur (e.g., the probability of which reference "0" or "1" will be traversed next). Thus, the encoder/decoder is provided with information so as to encode/decode each "0" or "1" event. In other words, the encoder/decoder has the alphabet {0, 1} and correspondent probabilities. Furthermore, the entropy-encoder retains the event itself to perform entropy efficient encoding. In the case of decoding, the entropy-encoder retains the incoming compressed (encoded) bit stream to execute the decoding of which event ("0" or "1") actually occurred. In some embodiments, an arithmetic-coder may be used for an efficient entropy-coding, or any other entropy efficient coding method.

The Suffix-Trie expansion logic in the context of the present invention is now described. FIG. 1 illustrates an exemplary process flow 100 for predicting a next bit in a bit stream, in accordance with the Suffix-Trie expansion logic. In general, the process may begin by determining whether a bit is received. At a first step 101, a determination is made whether there is a data bit within a received data stream that has not yet been processed. If there is no data bit to be processed, the process may terminate. If there is a data bit to be processed, the process may advance to an encoding/decoding and update process at step 102. The encoding/decoding and update process is described in more detail in the discussion of FIG. 4. Upon completion of the encoding/decoding and update process at step 102, a new suffix tree node is allocated at step 103, which may be represented by the code "nnd=ALLOC_NEW_NODE." The value "nnd" may refer to the index of the latest/newest allocated Suffix-Trie node.

Figure 2A:
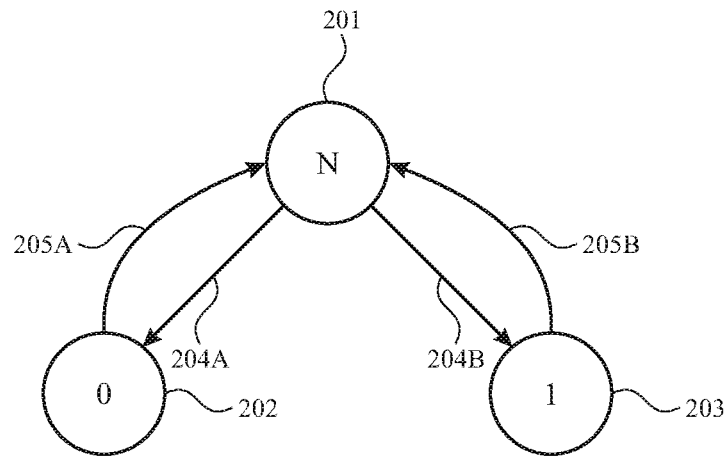
FIGS. 2A-2K illustrate the implementation of building a statistical model for determining the next bit in a data stream.

Reference is now made to FIGS. 2A-2K, which illustrate the implementation of expanding a Suffix-Trie for determining the next bit in a data stream. FIG. 2A illustrates a depiction of a Suffix-Trie prior to reception of any bits in a data stream. The Suffix-Trie may include one or more nodes, such as root node 201 and nodes 202-203. For example, node 202 may be associated with a value of "0" and node 203 may be associated with a value of "1." Root node may include a reference 204a to node 202. For example, reference 204a may be a "bit" reference to a bit value of "0," corresponding to node 202. Root node may further include a reference 204b to node 203. For example, reference 204b may be a "bit" reference to a bit value of "1," corresponding to node 203. Each of nodes 202-203 may include a suffix reference to a higher node on the Suffix-Trie. For example, node 202 may include suffix link 205a to root node 201. As another example, node 203 may include suffix link 205b to root node 201.

Figure 2B:
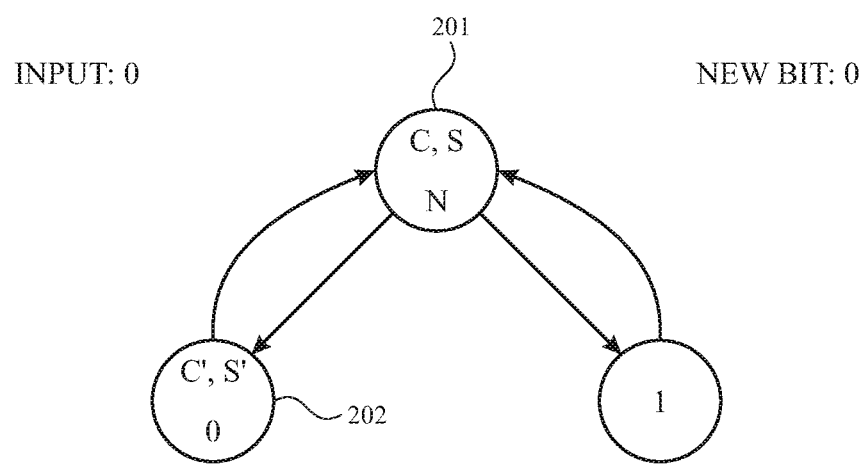

Referring now to FIG. 2B, a first stage of implementing Suffix-Trie building is depicted. In some embodiments, an input bit is detected, which may correspond to step 101 in FIG. 1. For example, an input bit may be detected having a value of "0." Thus, the total input bit stream may be represented as "0." A context node may be represented by the value "C," whereas a suffix node may be represented by the value "S." For example, as shown in FIG. 2B, a context node may be allocated, such as root node 201. Furthermore, a suffix node may be allocated, such as root node 201. In some embodiments, the allocation of suffix node 201 may correspond to step 103 in FIG. 1.

Referring back to FIG. 1, at step 104, a determination is made whether a current node has a bit reference corresponding to the value of the received input bit. The determination at step 104 may be represented by the code "IF((nxt=wnd[pos].nxt[BIT])==INFIN)." The value "wnd[pos].nxt[BIT]" may correspond to a reference to a node with longer suffixes/contexts. Upon a determination at step 104 that a current node has a bit reference corresponding to the value of the received input bit, the node allocated prior to a last created node may set a bit reference to a new node at step 109, which may be represented by the code "wnd[nod].nxt[BIT]=nnd." The value "nod" may refer to the index of the previously allocated node of the Suffix-Trie (e.g., the former "nnd"). The value "wnd[pos]" may refer to the current Suffix-Trie node where "pos" is the index of current Suffix-Trie node. Furthermore, at step 110, a new current position C' is set corresponding to the node having bit reference corresponding to the value of the received input bit, which may be represented by the code "pos=nxt." Step 110 may further include linking a suffix link of a new node to a new current position, which may be represented by the code "wnd[nnd].bck=pos." At step 111, a bit probability is copied from a new current position to a new node, which may be represented by the code "wnd[nnd].ep=wnd[pos].ep." At step 112, the latest allocated node is remembered, which may be represented by the code "nod=nnd."

Steps 104 and 109-112 are further described with reference to the exemplary Suffix-Trie expansion process in FIG. 2B. For example, upon detection of the bit value "0," a determination is made whether context node 201 has a reference to a node corresponding to the received bit value "0." Upon determining that root node 201 includes a reference to node 202, which has a value "0" corresponding to the received bit value of "0," node 202 is defined as the new context node C'. For example, new context C' would correspond to a bit sequence of "0." Node 202 may also be set as a new suffix node by reference to value S'. For example, new suffix-context S' would correspond to a bit sequence of "0." Referring back to FIG. 1, upon completing step 112, process flow may return to step 101 to determine if there is a next data bit within the received data stream that has not yet been processed.

Figure 2C:
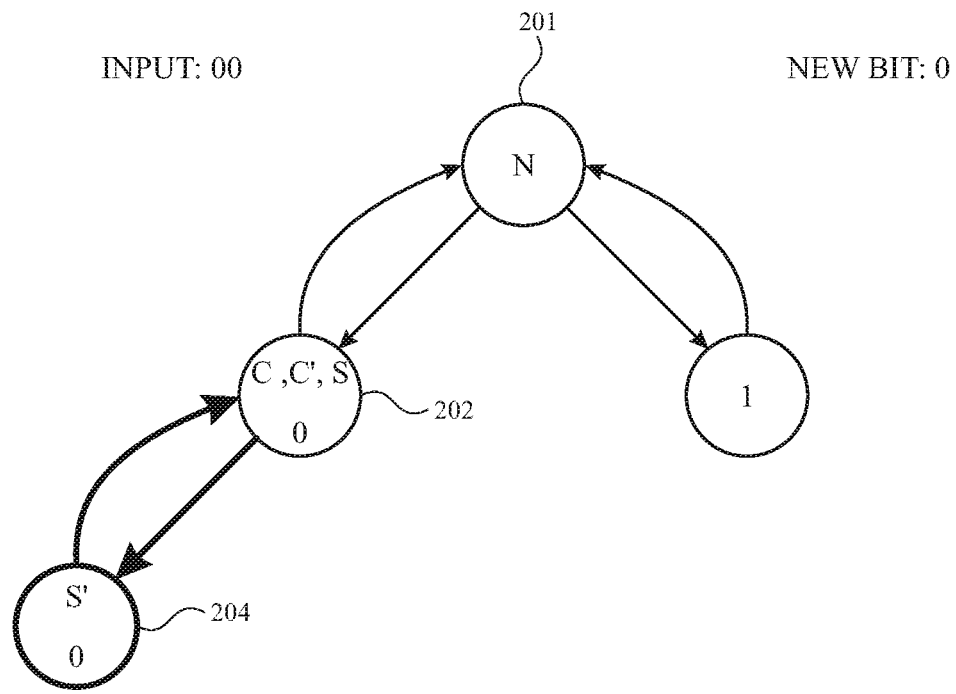

Referring now to FIG. 2C, a next stage of implementing Suffix-Trie expansion is depicted. As shown in FIG. 2C, node 202 having value "0" may be defined as the context node C and suffix node S, based on definitions created in the prior stage depicted in FIG. 2B. In some embodiments, a new input bit is detected. For example, a new input bit may be detected having a value of "0." Thus, the total input bit stream may be represented as "00." With reference back to FIG. 1, at step 104, a determination is made whether a current node has a bit reference corresponding to the value of the received input bit. Upon a determination at step 104 that a current node does not have a bit reference corresponding to the value of the received input bit, the current node sets a bit reference to a new node at step 105, which may be represented by the code "wnd[pos].nxt[BIT]=nnd." Furthermore, at step 106, a probability of a current node is updated. Probability updating may be represented by the code "wnd[pos].p=UPDATE P(wnd[pos].p, BIT, p.d[0])," which may correspond to the equation "P=P+(BIT−P)/D," where D is an updating coefficient. The probability updating is described in further detail with respect to FIG. 4. Step 106 may further include traversing back along a suffix link to a shorter suffix, which may be represented by the code "pos=wnd[pos].bck." The value "wnd[pos].bck" may correspond to a suffix link to a shorter context.

At step 107, determination is made whether a current node has a bit reference corresponding to the value of the received input bit. Upon a determination that a current node does not have a bit reference corresponding to the value of the received input bit, step 106 is repeated. Upon a determination that a current node does have a bit reference corresponding to the value of the received input bit, the probability of the current node is updated at step 108, which may be represented by the code "wnd[pos].p=UPDATE_P(wnd[pos].p, BIT, p.d[1])." At step 110, a new current position C' is set corresponding to the node having bit reference corresponding to the value of the received input bit, which may be represented by the code "pos=nxt." Step 110 may further include linking a suffix link of a new node to a new current position, which may be represented by the code "wnd[nnd].bck=pos." Furthermore, at step 111, a bit probability is copied from a new current position to a new node, which may be represented by the code "wnd[nnd].ep=wnd[pos].ep." At step 112, the latest allocated node is remembered, which may be represented by the code "nod=nnd."

With reference back to FIG. 2C, steps 104-108 and 110-112 are further described. Upon detection of the bit value "0," a determination is made whether context node 202 has a reference to a node corresponding to the received bit value "0." Upon determination that context node 202 does not have a reference to a node corresponding to the received bit value "0," a new node having a value corresponding to the received bit value "0" may be created. For example, new node 204 having a value of "0" may be created. New node 204 may be defined as new suffix node S'. For example, new suffix-context S' would correspond to a bit sequence of "00."

Furthermore, a new reference from context node 202 to new node 204 may be created. Upon creation of a new node, the Suffix-Trie may be traversed to determine a higher node having a reference to a node corresponding to the received bit value "0." For example, the suffix link of context node 202 is traversed to root node 201. Upon determination that root node 201 has a reference to node 202 having value "0" corresponding to the received bit value "0," node 202 may be defined as a new context node C'. For example, new context C' would correspond to a bit sequence of "0." Upon defining node 202 as new context node C', one or more probabilities associated with new context node 202 may be copied from new context node 202 to new suffix node 204. Furthermore, a new suffix link may be created from new suffix node 204 to new context node 202.

Figure 2D:
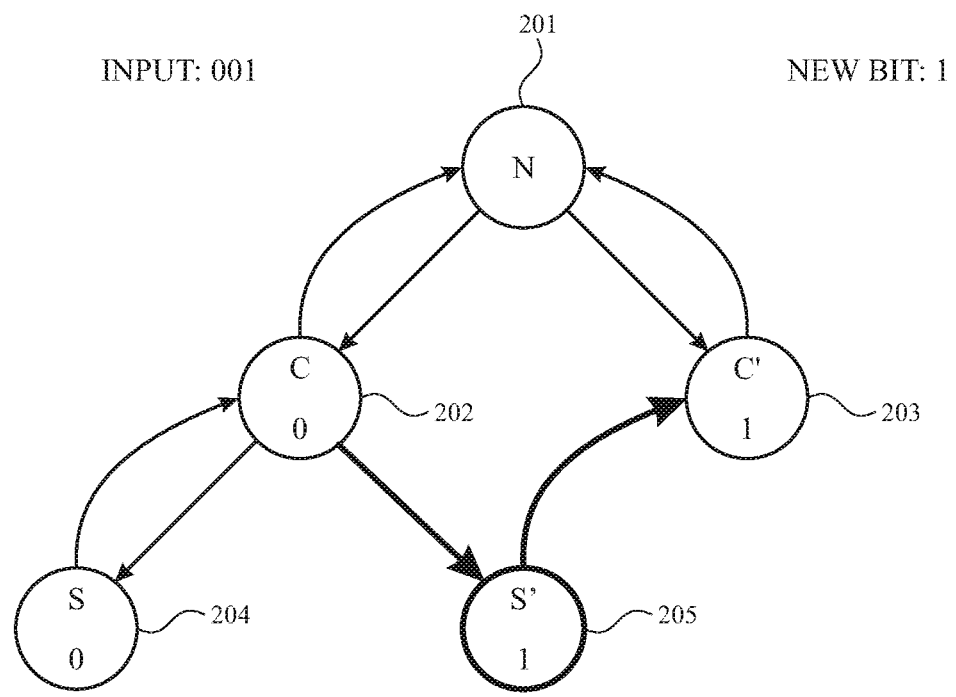

Referring now to FIG. 2D, a next stage of implementing Suffix-Trie expansion is depicted. As shown in FIG. 2D, node 202 having value "0" may be defined as the context node C, where node 204 having value "0" may be defined as the suffix node S, based on definitions created in the prior stage depicted in FIG. 2C. In some embodiments, a new input bit is detected. For example, a new input bit may be detected having a value of "1." Thus, the total input bit stream may be represented as "001." Upon detection of the bit value "1," a determination is made whether context node 202 has a reference to a node corresponding to the received bit value "1." Upon determination that context node 202 does not have a reference to a node corresponding to the received bit value "1," a new node having a value corresponding to the received bit value "1" may be created. The following process of FIG. 2D may thus correspond to steps 105-108 and 110-112 of FIG. 1. For example, new node 205 having a value of "1" may be created, where new node 205 may be defined as new suffix node S'. For example, new suffix-context S' would correspond to a bit sequence of "01."

Furthermore, a new reference from context node 202 to new suffix node 205 may be created. Upon creation of new suffix node 205, the Suffix-Trie may be traversed to determine a higher node having a reference to a node corresponding to the received bit value "1." For example, the suffix link of context node 202 is traversed to root node 201. Upon determination that root node 201 has a reference to node 203 having value "1" corresponding to the received bit value "1," node 203 may be defined as a new context node C'. For example, new context C' would correspond to a bit sequence of "1." Upon defining node 203 as new context node C', one or more probabilities associated with new context node 203 may be copied from new context node 203 to new suffix node 205. Furthermore, a new suffix link may be created from new suffix node 205 to new context node 203.

Figure 2E:
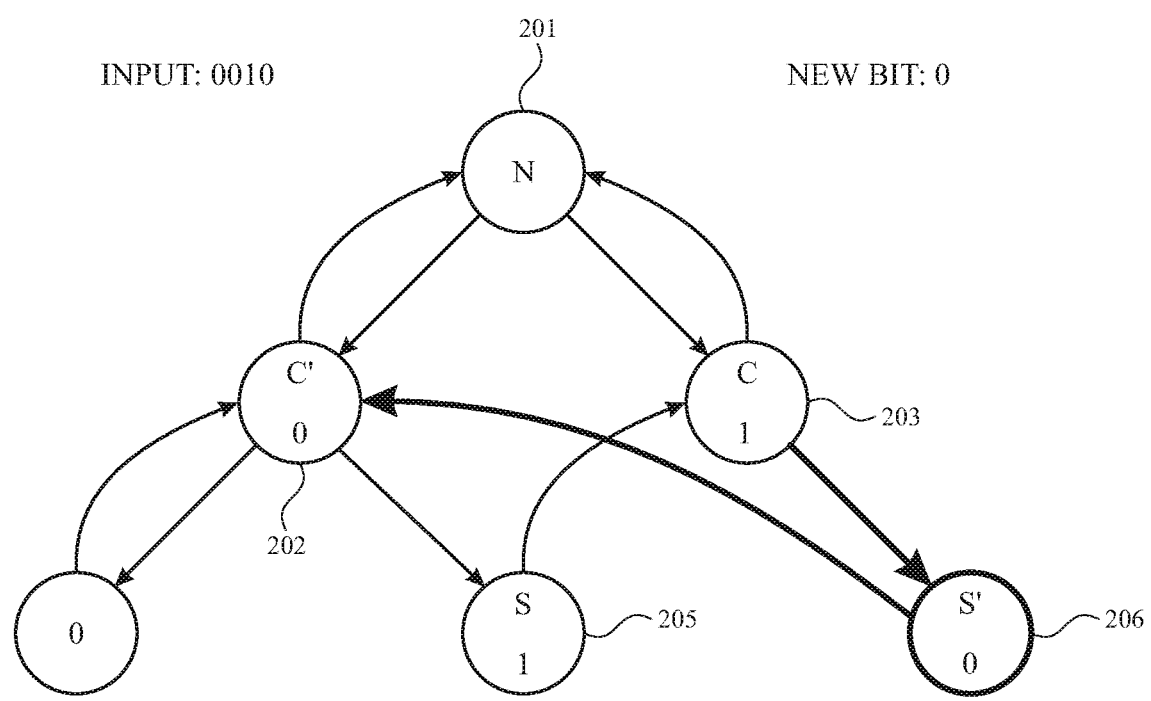

Referring now to FIG. 2E, a next stage of implementing Suffix-Trie building is depicted. As shown in FIG. 2E, node 203 having value "1" may be defined as the context node C, where node 205 having value "1" may be defined as the suffix node S, based on definitions created in the prior stage depicted in FIG. 2D. In some embodiments, a new input bit is detected. For example, a new input bit may be detected having a value of "0." Thus, the total input bit stream may be represented as "0010." Upon detection of the bit value "0," a determination is made whether context node 203 has a reference to a node corresponding to the received bit value "0." Upon determination that context node 203 does not have a reference to a node corresponding to the received bit value "0," a new node having a value corresponding to the received bit value "0" may be created. The following processes of FIG. 2E may thus correspond to steps 105-108 and 110-112 of FIG. 1. For example, new node 206 having a value of "0" may be created, where new node 206 may be defined as new suffix node S'. For example, new suffix-context S' would correspond to a bit sequence of "10."

Furthermore, a new reference from context node 203 to new suffix node 206 may be created. Upon creation of new suffix node 206, the Suffix-Trie may be traversed to determine a higher node having a reference to a node corresponding to the received bit value "0." For example, the suffix link of context node 203 is traversed to root node 201. Upon determination that root node 201 has a reference to node 202 having value "0" corresponding to the received bit value "0," node 202 may be defined as a new context node C'. For example, new context C' would correspond to a bit sequence of "0." Upon defining node 202 as new context node C', one or more probabilities associated with new context node 202 may be copied from new context node 202 to new suffix node 206. Furthermore, a new suffix link may be created from new suffix node 206 to new context node 202.

Figure 2F:
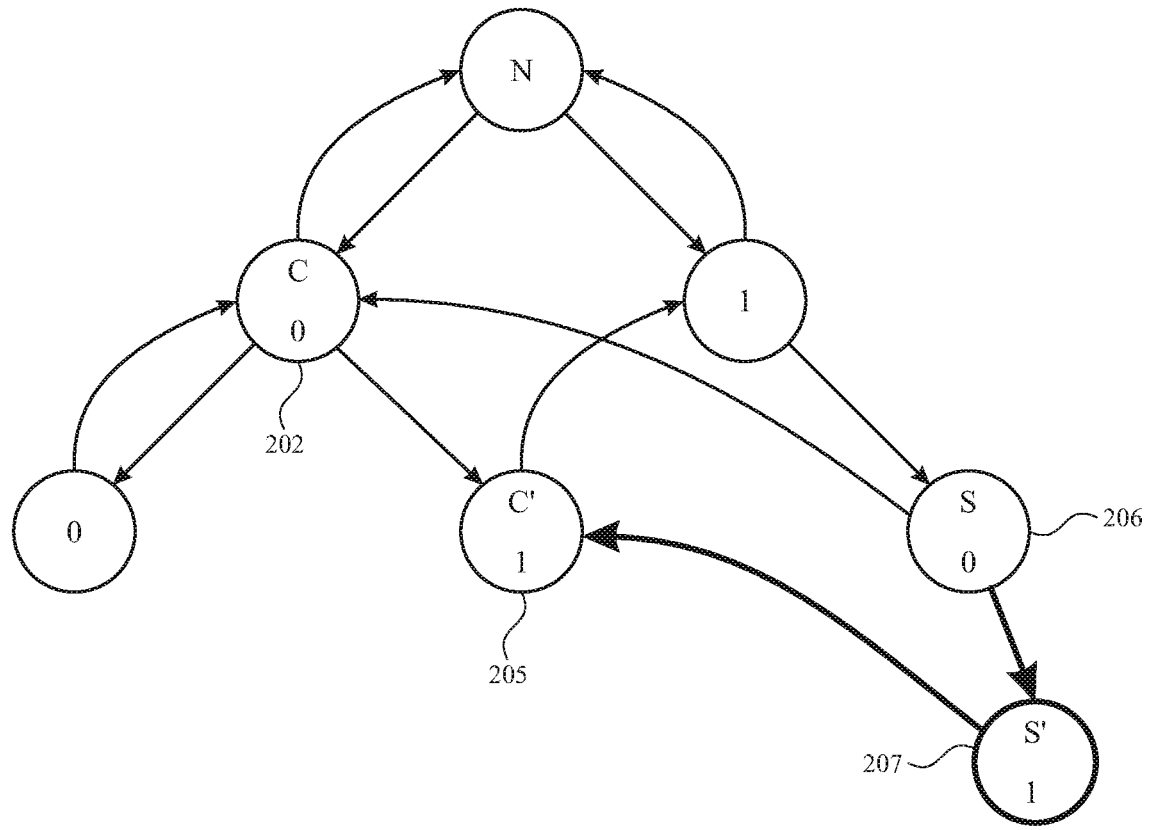

Referring now to FIG. 2F, a next stage of implementing Suffix-Trie expansion is depicted. As shown in FIG. 2F, node 202 having value "0" may be defined as the context node C, where node 206 having value "0" may be defined as the suffix node S, based on definitions created in the prior stage depicted in FIG. 2E. In some embodiments, a new input bit is detected. For example, a new input bit may be detected having a value of "1." Thus, the total input bit stream may be represented as "00101." Upon detection of the bit value "1," a determination is made whether context node 202 has a reference to a node corresponding to the received bit value "1." Upon determination that context node 202 does have a reference to node 205 corresponding to the received bit value "1," node 205 may be defined as the new context node C'. The following processes of FIG. 2F may thus correspond to steps 109-112 of FIG. 1. For example, new context C' would correspond to a bit sequence of "01." Furthermore, upon determination that a context node has a reference to a node corresponding to the received bit value, a new node may be created from a current suffix node. For example, new node 207 having a value of "1" may be created from current suffix node 206, where new node 207 may be defined as new suffix node S'. For example, new suffix-context S' would correspond to a bit sequence of "101." A new reference may be created from current suffix node 206 to new suffix node 207. Furthermore, one or more probabilities associated with new context node 205 may be copied from new context node 205 to new suffix node 207, where a new suffix link may be created from new suffix node 207 to new context node 205.

Figure 2G:
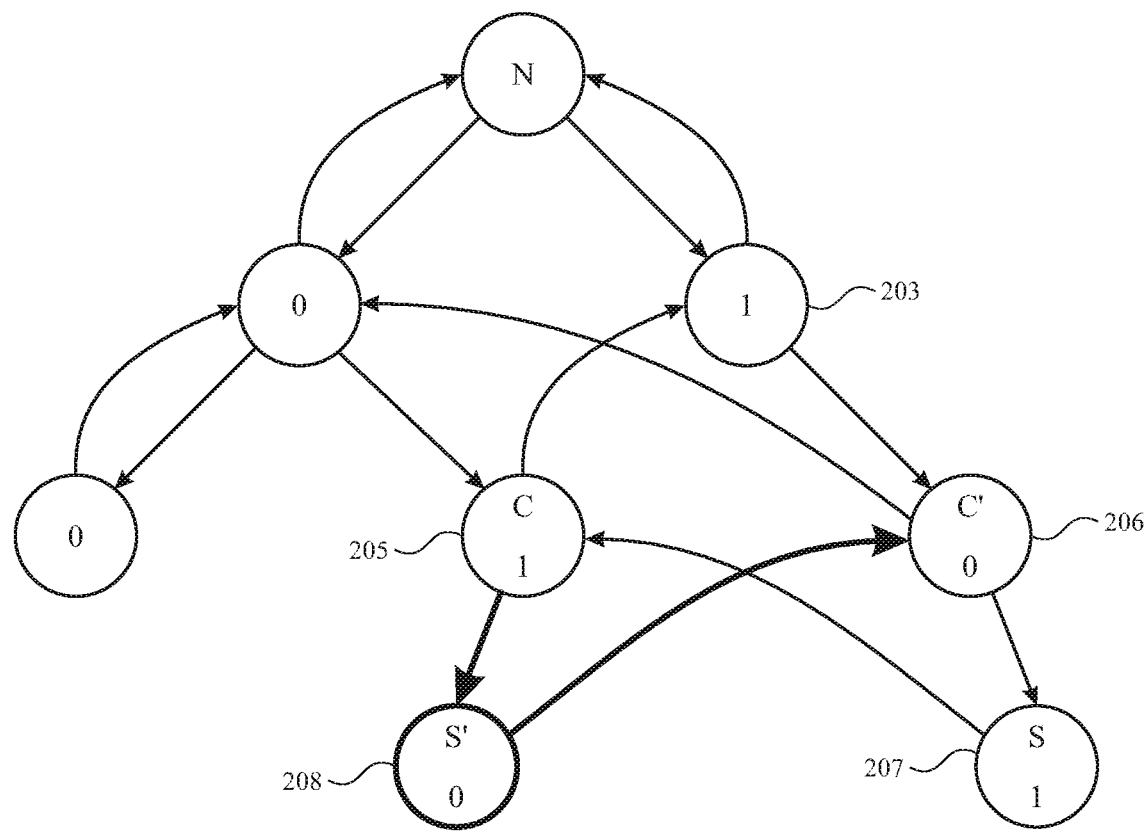

Referring now to FIG. 2G, a next stage of implementing Suffix-Trie expansion is depicted. As shown in FIG. 2G, node 205 having value "1" may be defined as the context node C, where node 207 having value "1" may be defined as the suffix node S, based on definitions created in the prior stage depicted in FIG. 2F. In some embodiments, a new input bit is detected. For example, a new input bit may be detected having a value of "0." Thus, the total input bit stream may be represented as "001010." Upon detection of the bit value "0," a determination is made whether context node 205 has a reference to a node corresponding to the received bit value "0." Upon determination that context node 205 does not have a reference to a node corresponding to the received bit value "0," a new node having a value corresponding to the received bit value "0" may be created. The following processes of FIG. 2G may thus correspond to steps 105-108 and 110-112 of FIG. 1. For example, new node 208 having a value of "0" may be created, where new node 208 may be defined as new suffix node S'. For example, new suffix-context S' would correspond to a bit sequence of "010."

Furthermore, a new reference from context node 205 to new suffix node 208 may be created. Upon creation of new suffix node 208, the Suffix-Trie may be traversed to determine a higher node having a reference to a node corresponding to the received bit value "0." For example, the suffix link of context node 205 is traversed to node 203. Upon determination that node 203 has a reference to node 206 having value "0" corresponding to the received bit value "0," node 206 may be defined as a new context node C'. For example, new context C' would correspond to a bit sequence of "10." Upon defining node 206 as new context node C', one or more probabilities associated with new context node 206 may be copied from new context node 206 to new suffix node 208. Furthermore, a new suffix link may be created from new suffix node 208 to new context node 206.

Figure 2H:
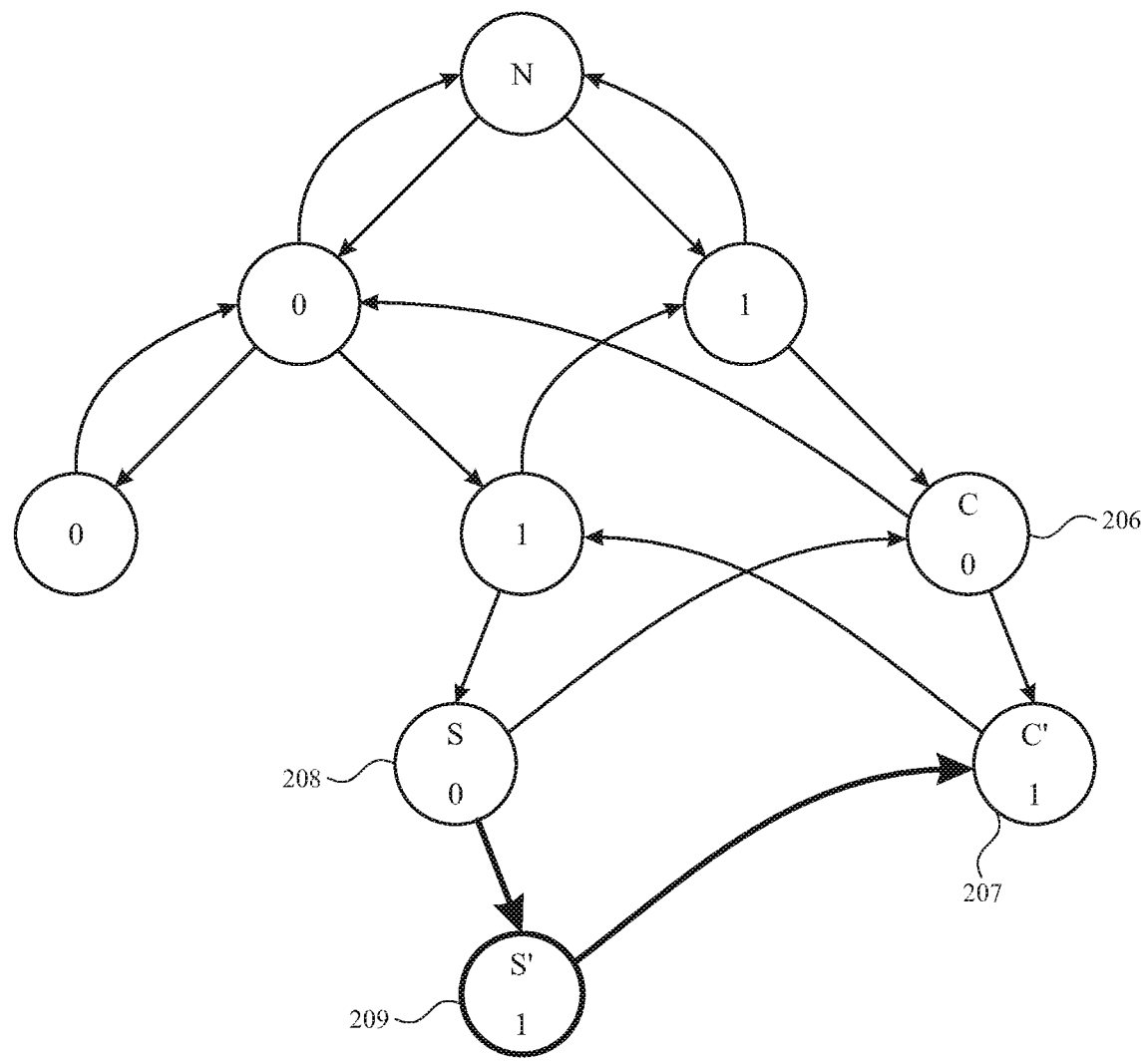

Referring now to FIG. 2H, a next stage of implementing Suffix-Trie expansion is depicted. As shown in FIG. 2H, node 206 having value "0" may be defined as the context node C, where node 208 having value "0" may be defined as the suffix node S, based on definitions created in the prior stage depicted in FIG. 2G. In some embodiments, a new input bit is detected. For example, a new input bit may be detected having a value of "1." Thus, the total input bit stream may be represented as "0010101." Upon detection of the bit value "1," a determination is made whether context node 206 has a reference to a node corresponding to the received bit value "1." Upon determination that context node 206 does have a reference to node 207 corresponding to the received bit value "1," node 207 may be defined as the new context node C'. The following processes of FIG. 2H may thus correspond to steps 109-112 of FIG. 1. For example, new context C' would correspond to a bit sequence of "101." Furthermore, upon determination that context node 206 has a reference to node 207 corresponding to the received bit value, a new node 209 having value "1" may be created from current suffix node 208. New node 209 may be defined as new suffix node S'. For example, new context S' would correspond to a bit sequence of "0101." A new reference may be created from current suffix node 208 to new suffix node 209. Furthermore, one or more probabilities associated with new context node 207 may be copied from new context node 207 to new suffix node 209, where a new suffix link may be created from new suffix node 209 to new context node 207.

Figure 2I:
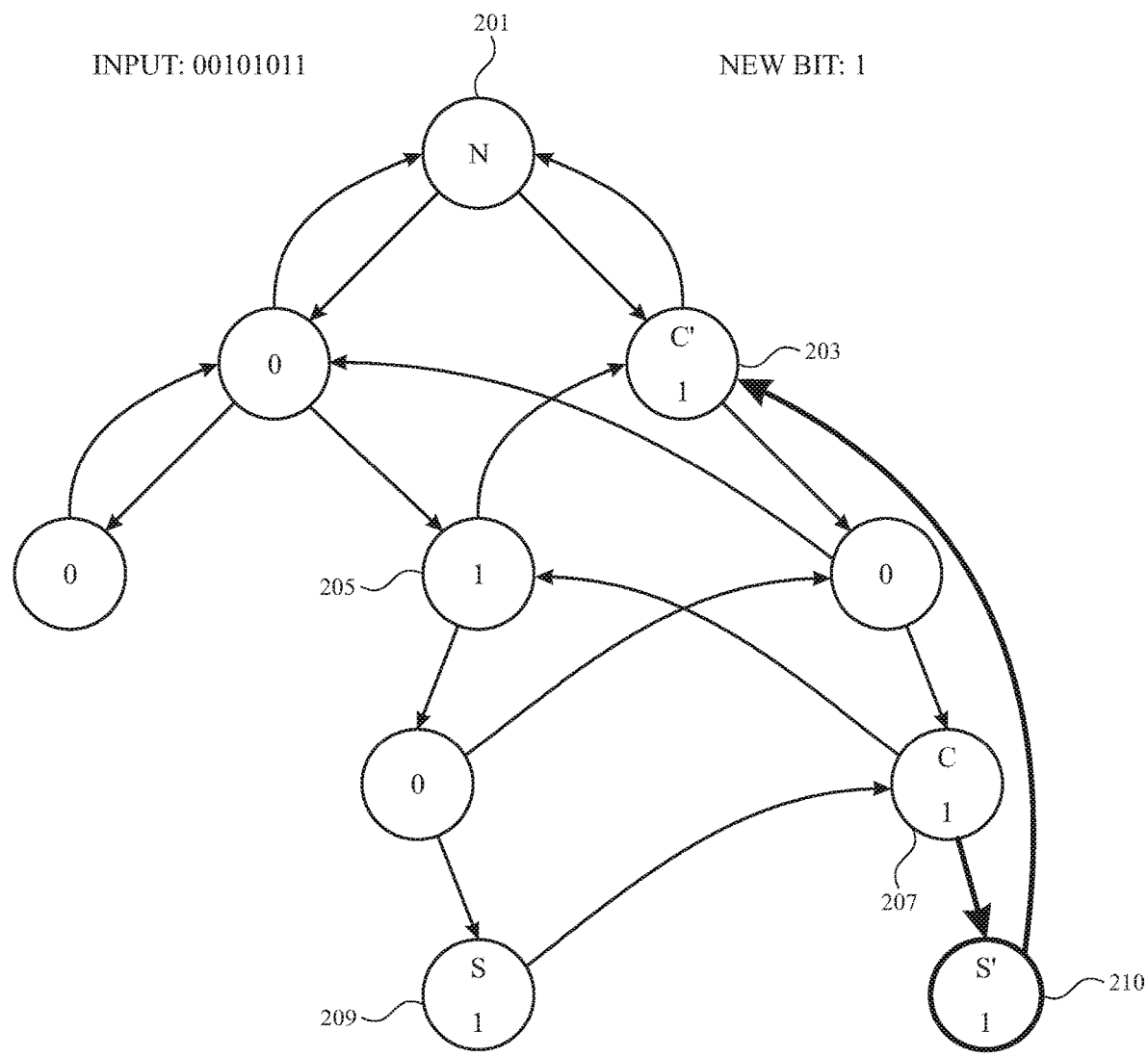

Referring now to FIG. 2I, a next stage of implementing Suffix-Trie expansion is depicted. As shown in FIG. 2I, node 207 having value "1" may be defined as the context node C, where node 209 having value "1" may be defined as the suffix node S, based on definitions created in the prior stage depicted in FIG. 2H. In some embodiments, a new input bit is detected. For example, a new input bit may be detected having a value of "1." Thus, the total input bit stream may be represented as "00101011." Upon detection of the bit value "1," a determination is made whether context node 207 has a reference to a node corresponding to the received bit value "1." Upon determination that context node 207 does not have a reference to a node corresponding to the received bit value "1," a new node having a value corresponding to the received bit value "1" may be created. The following processes of FIG. 2I may thus correspond to steps 105-108 and 110-112 of FIG. 1. For example, new node 210 having a value of "1" may be created, where new node 210 may be defined as new suffix node S'. For example, new suffix-context S' would correspond to a bit sequence of "1011."

Furthermore, a new reference from context node 207 to new suffix node 210 may be created. Upon creation of new suffix node 210, the Suffix-Trie may be traversed to determine a higher node having a reference to a node corresponding to the received bit value "1." For example, the suffix link of context node 207 is traversed to node 205. Upon determination that node 205 does not have a reference to a node having value "1" corresponding to the received bit value "1," Suffix-Trie traversal continues. For example, a suffix link from node 205 is traversed to node 203. Upon determination that node 203 does not have a reference to a node having value "1" corresponding to the received bit value "1," Suffix-Trie traversal continues. For example, a suffix link from node 203 is traversed to root node 201. Upon determination that root node 201 does have a reference to node 203 having value "1" corresponding to the received bit value 1," node 203 may be defined as the new context node C'. For example, new context C' would correspond to a bit sequence of "1." Upon defining node 203 as new context node C', one or more probabilities associated with new context node 203 may be copied from new context node 203 to new suffix node 210. Furthermore, a new suffix link may be created from new suffix node 210 to new context node 203.

Figure 2J:
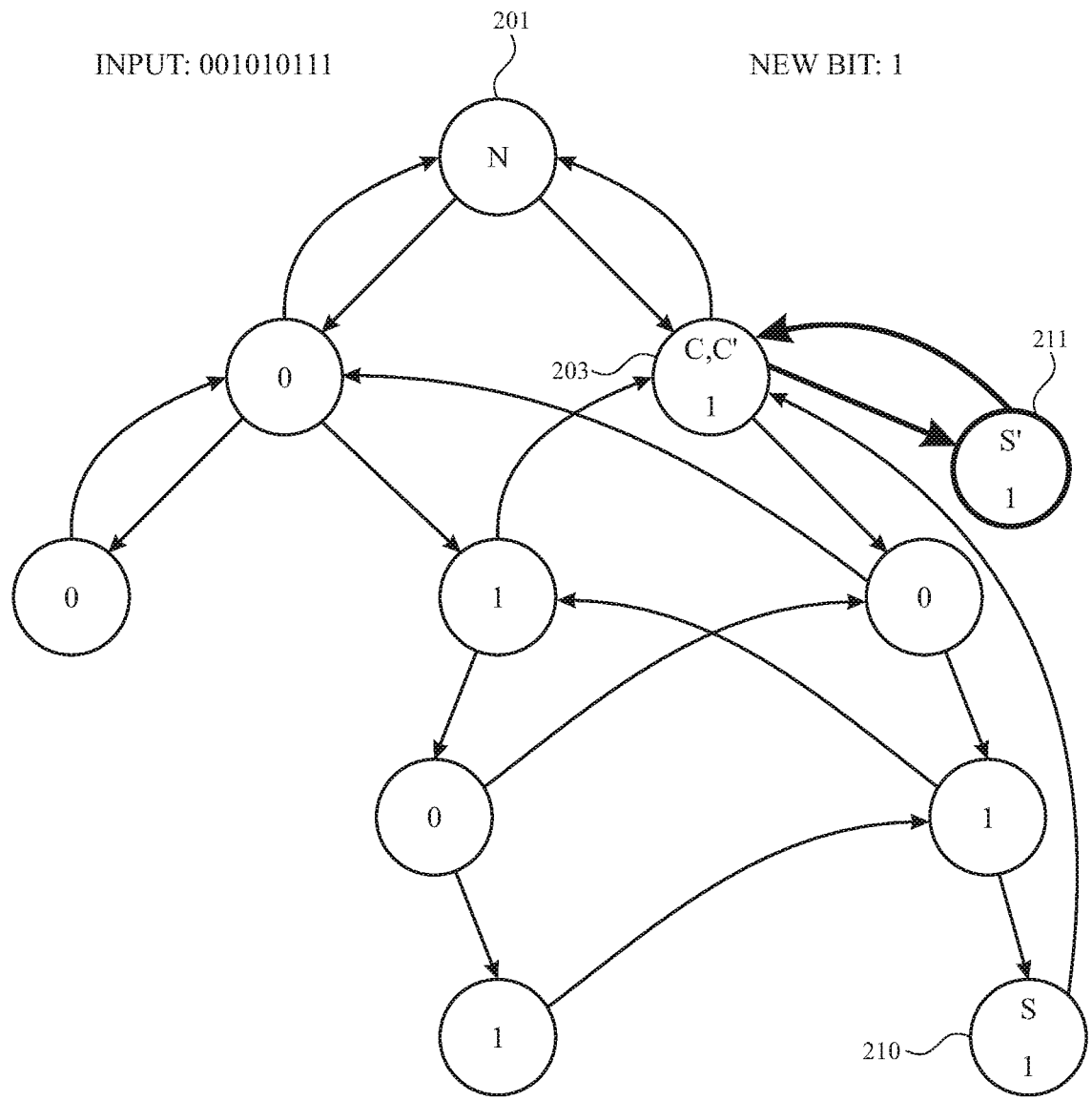

Referring now to FIG. 2J, a next stage of implementing Suffix-Trie expansion is depicted. As shown in FIG. 2J, node 203 having value "1" may be defined as the context node C, where node 210 having value "1" may be defined as the suffix node S, based on definitions created in the prior stage depicted in FIG. 2I. In some embodiments, a new input bit is detected. For example, a new input bit may be detected having a value of "1." Thus, the total input bit stream may be represented as "001010111." Upon detection of the bit value "1," a determination is made whether context node 203 has a reference to a node corresponding to the received bit value "1." Upon determination that context node 203 does not have a reference to a node corresponding to the received bit value "1," a new node having a value corresponding to the received bit value "1" may be created. The following processes of FIG. 2D may thus correspond to steps 105-108 and 110-112 of FIG. 1. For example, new node 211 having a value of "1" may be created, where new node 211 may be defined as new suffix node S'. For example, new suffix-context S' would correspond to a bit sequence of "11."

Furthermore, a new reference from context node 203 to new suffix node 211 may be created. Upon creation of new suffix node 211, the Suffix-Trie may be traversed to determine a higher node having a reference to a node corresponding to the received bit value "1." For example, the suffix link of context node 203 is traversed to root node 201. Upon determination that root node 201 does have a reference to node 203 having value "1" corresponding to the received bit value "1," node 203 may be defined as the new context node C'. For example, new context C' would correspond to a bit sequence of "1." Upon defining node 203 as new context node C', one or more probabilities associated with new context node 203 may be copied from new context node 203 to new suffix node 211. Furthermore, a new suffix link may be created from new suffix node 211 to new context node 203.

Figure 2K:
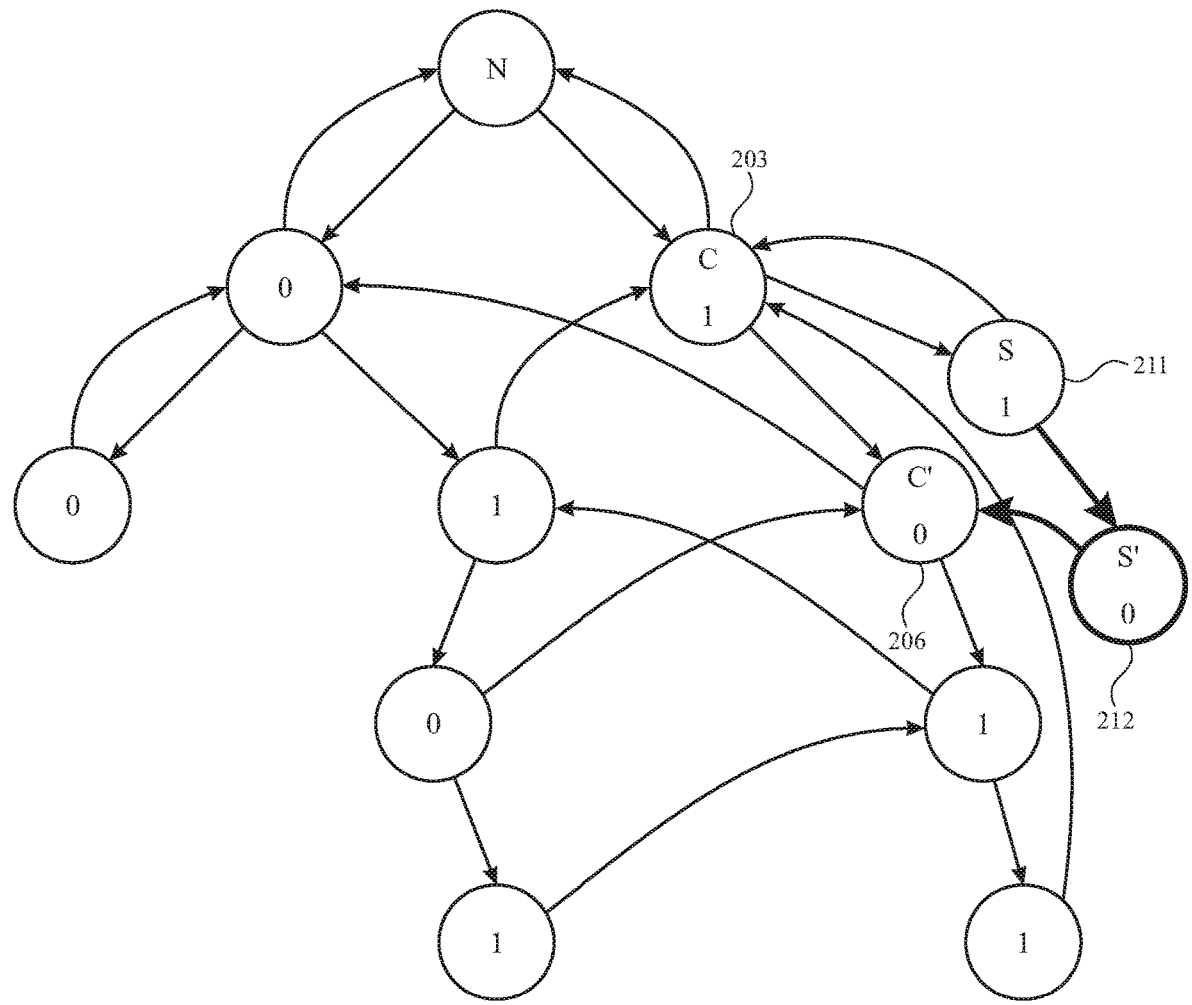

Referring now to FIG. 2K, a next stage of implementing Suffix-Trie building is depicted. As shown in FIG. 2K, node 203 having value "1" may be defined as the context node C, where node 211 having value "1" may be defined as the suffix node S, based on definitions created in the prior stage depicted in FIG. 2J. In some embodiments, a new input bit is detected. For example, a new input bit may be detected having a value of "0." Thus, the total input bit stream may be represented as "0010101110." Upon detection of the bit value "0," a determination is made whether context node 203 has a reference to a node corresponding to the received bit value "0." Upon determination that context node 203 does have a reference to a node 206 corresponding to the received bit value "1," node 206 may be defined as the new context node C'. The following processes of FIG. 2D may thus correspond to steps 109-112 of FIG. 1. For example, new context C' would correspond to a bit sequence of "10." Furthermore, a new node having a value corresponding to the received bit value "1" may be created from the current suffix node. For example, a new node 212 having a value of "1" may be created from current suffix node 211, where new node 212 may be defined as new suffix node S'. For example, new suffix-context S' would correspond to a bit sequence of "110." A new reference may be created from current suffix node 211 to new suffix node 212. Furthermore, one or more probabilities associated with new context node 206 may be copied from new context node 206 to new suffix node 212, where a new suffix link may be created from new suffix node 212 to new context node 206.

Although further stages in the Suffix-Trie expansion are not further described herein, the Suffix-Trie expansion may continue in accordance with the process flow defined in FIG. 1. As described with respect to FIGS. 1 and 2A-2K, for every failed attempt to reach a longer context, the encoder/decoder traverses back along suffix-links to a shorter context-suffix until a node with available "0" or "1" reference to a longer context is reached. A "failed" node (e.g., a node where no longer context is found), is further remembered, and once a node with an available reference is found, the failed node receives a new reference to the newly added node. The newly added node receives a suffix-link to the node which is referenced by the found node having available 0/1 reference, and further receives probability information from the found node. Accordingly, each newly added node is treated as a failed node, and thus, the last failed branch continues to expand and replicate upon existing paths as the encoder/decoder traverses forward along "0" or "1" references.

Although Suffix-Trie expansion may be achieved according to other variations or conventions, such alternative approaches have been demonstrated to achieve significantly lower performance than that of the present invention. For example, a new branch may grow only a single step forward for each failure to move along a "0" or "1" reference. As another example, the branch may continue to expand not from the last longest failed suffix but from the last shortest failed suffix (e.g., the last failed node on the way along suffix links). As yet another example, the branch may continue to expand not from the first or the latest failed suffix, but somewhere in the middle of the tree. Furthermore, each new branch may be limited to expansion of not more than a predefined N number of steps. Among these multiple versions of Suffix-Trie expansion, only the version demonstrated in accordance with the present invention achieves a dramatic performance advantage.

Figure 3:
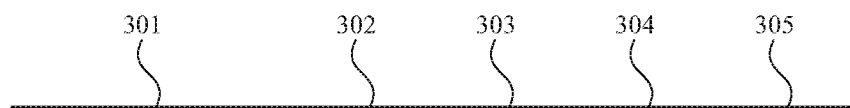
FIG. 3 illustrates a table depicting different stages in statistical model expansion.

FIG. 3 illustrates table 300 depicting different stages in Suffix-Trie building. For example, table 300 may include input bit sequence column 301, current context C column 302, current suffix-context column 303, new context C' column 304, and new suffix-context S' column 305. Table 300 may correspond to various stages within exemplary Suffix-Trie expansion stages depicted in FIGS. 2A-2J. For example, the Suffix-Trie building stage depicted in FIG. 2D may be represented in table 300 by a row including input bit sequence "001," current context C "0," current suffix-context S "00," new current context C' "1," and new suffix-context S' "01." Furthermore, for example, the Suffix-Trie building stage depicted in FIG. 2G may be represented in table 300 by a row including input bit sequence "001010," current context C "01," current suffix-context S "101," new current context C' "10," and new suffix-context S' "010."

The probability updating procedure will now be described in further detail. In some embodiments, the probability updating procedure may correspond to step 103 in FIG. 1. Traditionally, the probability of a specific event may be computed as a number of specific events having occurred in the past divided by a total number of observed events. This traditional way of computing probability is increasingly inaccurate for smaller number of samples (known as a "zero frequency problem"). With respect to Suffix-Trie nodes, the deeper a Suffix-Trie node is positioned within the Suffix-Trie, the longer context-suffix the node represents. Furthermore, a deeper positioning of a Suffix-Trie node corresponds to less frequent visiting of the node within the Suffix-Trie. Thus, the longer a context-suffix of a node, the rarer the occurrence of the context-suffix represented by the node. The following formula may therefore be used to compute the probability of an event_1: $P'=P+(0/1-P)/w$; where (i) "0/1" represents the specific event (e.g., "event_0" or "event_1") which triggered a current update, (ii) P is the current probability of the event "1", (iii) P' is the updated probability of the event "1", and (iv) "w" is the coefficient indicating how aggressive or dynamic the updating should be. For example, a "w" value of 1.3 represents aggressive updating while a "w" value of 100 represents conservative updating. In some embodiments, "w" may be utilized in order to tune the probability updating algorithm as described herein. Furthermore, the probability of an event_0 may be represented as (1−P).

The propagation of probabilities across nodes of the Suffix-Trie will now be described. In some embodiments, each new node which is added to the Suffix-Trie may borrow and/or copy the probability from a node that the new node has a suffix link with. Furthermore, when traversing the Suffix-Trie, every visited node may be updated with probabilities of a chain of nodes which are suffix linked from a current node. In some embodiments, a depth or number of involved nodes to be updated along a suffix-link chain may be the subject of balancing speed vs. compression. A higher number of nodes involved may result in a higher amount of composite information gathered, and therefore, may result in the creation of a more accurate representation of probability from different contexts. Accordingly, the combination of fine-tuned probability updating with the specific Suffix-Trie management processes as described herein results in an efficient and robust method for bit prediction.

The probability updating procedure may include three major components: composition, adjustment, and updating. The composition component refers to composition of probabilities along all nodes involved, which includes defining a weighted sum of probabilities from different contexts along a suffix-link chain. The sum of all weighting coefficients used within composition should be equal to 1.0, but such coefficients could be either positive or negative numbers. The specific value of weighting coefficients is the subject of algorithm tuning. Furthermore, the adjustment component includes defining a weighted sum of two numbers: the original probability of each involved node and the value of composite probability (corresponding to the composition component). The sum of both weighting coefficients should be equal to 1.0, but coefficients could be either a positive or negative numbers. The specific value of weight-coefficients is the subject of algorithm tuning. The updating component involves executing an operation for each i-node involved, defined by $Pi'=Pi+(0/1-Pi)/wi$; where (i) the values Pi are the results of composition and adjustment, (ii) Pi' are the final results of updating of each i-node involved, and (iii) the specific value of the 'wi' coefficient is the subject of algorithm tuning, and is a data dependent parameter.

Furthermore, the specific values of all weighting coefficients are not predefined by any formula, the optimal parameters (ensuring the maximum compression) are data dependent, and optimal values may vary significantly for different types of data. However, given the compactness of the present invention, the number of parameters are small enough to apply a greedy optimization procedure such as gradient descent, in order to achieve the maximum compression for the type of data used during greedy optimization training. As discussed herein, the default values of weighting coefficients were obtained by training the system with a wide variety of different data sets.

Figure 4:
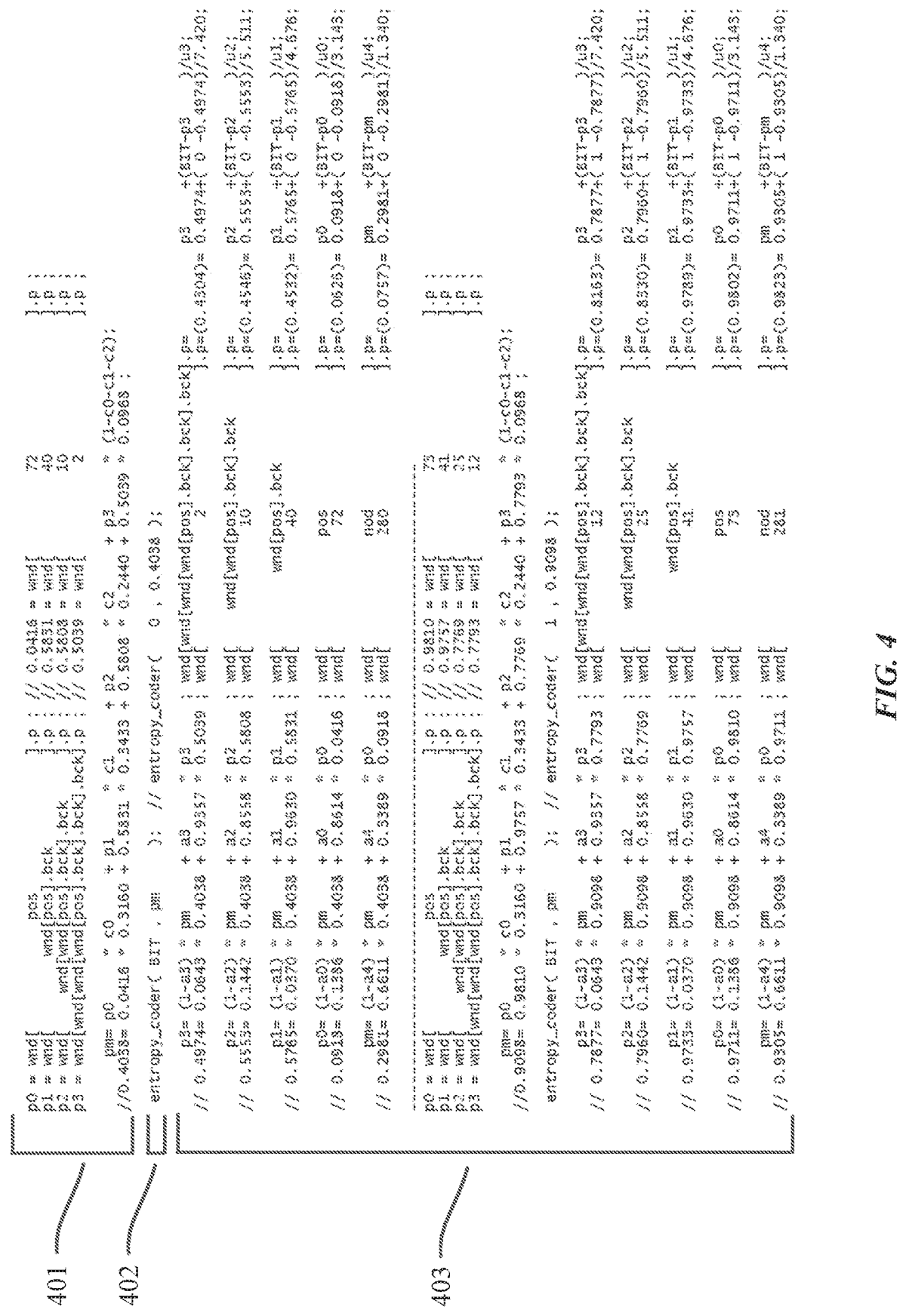

FIG. 4 illustrates a numerical example of the probability updating procedure. In some embodiments, code within section 401 represents code directed to the composition component. In some embodiments, code within section 402 represents code directed to the encoding/decoding component. In some embodiments, code within section 403 represents code directed to the adjustment and updating components. As shown in FIG. 4, comments having numerical examples are included. With reference to FIG. 4, {c0 . . . c2} may be defined as composition weighting coefficients, {a0 . . . a4} may be defined as adjustment weighting coefficients, and {u0 . . . u4} may be defined as updating weighting coefficients. The optimal values of all weighting coefficients for maximum compression may be data dependent and subject of algorithm tuning for particular type of data. For example, a greedy optimization procedure such as gradient descent may be applied to find a local optimum for a broad spectrum of different types of data, for example, to obtain maximum compression for a specific data type. The depth along suffix links are a matter of compromising speed for compression. For example, the exemplary updating procedure depicted in FIG. 4 illustrates a depth x4 {p0 . . . p3} along the chain of suffix links, but generally, the length and/or depth along suffix links chain is not limited until it reaches the root of the Suffix-Trie.

Optimization of data compression is now described. Due to algorithm efficiency and a small number of parameters (e.g., 11 floats for NORM mode, as shown Table 1 below), direct optimization of parameters is an effective method when optimizing the algorithm for specific data types. In particular, the gradient descent method is advantageous in searching for a local minimum, in order to achieve a maximum compression. Using this method, compression gain for specific data is typically within 2%, although for atypical data, compression gain may exceed 15%. Furthermore, weighting coefficients may also be directed to negative values, and therefore, inverse context dependency may be exploited as well. In some embodiments, the Suffix-Trie may be prebuilt with known data of a particular type, where encoding/decoding may commence with a well-developed Suffix-Trie. Such a method is particularly advantageous where a small portion of data must be compressed, and thus, the resulting compression gain may be substantial. For example, compression of four kilobytes of text may have a compress-ratio of 2:1 or less, but with a prebuilt model, the compress-ratio may reach 5:1. The source code for maintaining a statistical model to predict the next bit in a bit stream, as described herein, is reproduced below.

The present invention may also be advantageous for data security and data encryption. In order to decode data, a decoding session must have the identical model used during encoding. For example, the model may be a composition of weights-coefficients and the Suffix-Trie. Dynamic message encryption may also be supported based at least on use of a prebuilt Suffix-Trie as described herein. For example, an encoded message changes the Suffix-Trie structure, such that the next encoded message uses an updated Suffix-Trie. Thus, a receipient of the encoded message may only decode the messages if the recipient updates the model in the same order as done in the Suffix-Trie. For example, if the model were not updated, any encoded message received in the middle of a plurality of messages may not be decoded without the knowledge of all sent-messages, and the particular order in which messages have been sent. Accordingly, all transferred messages represent a single password which is constantly expanding by each newly encoded message.

Figure 5:
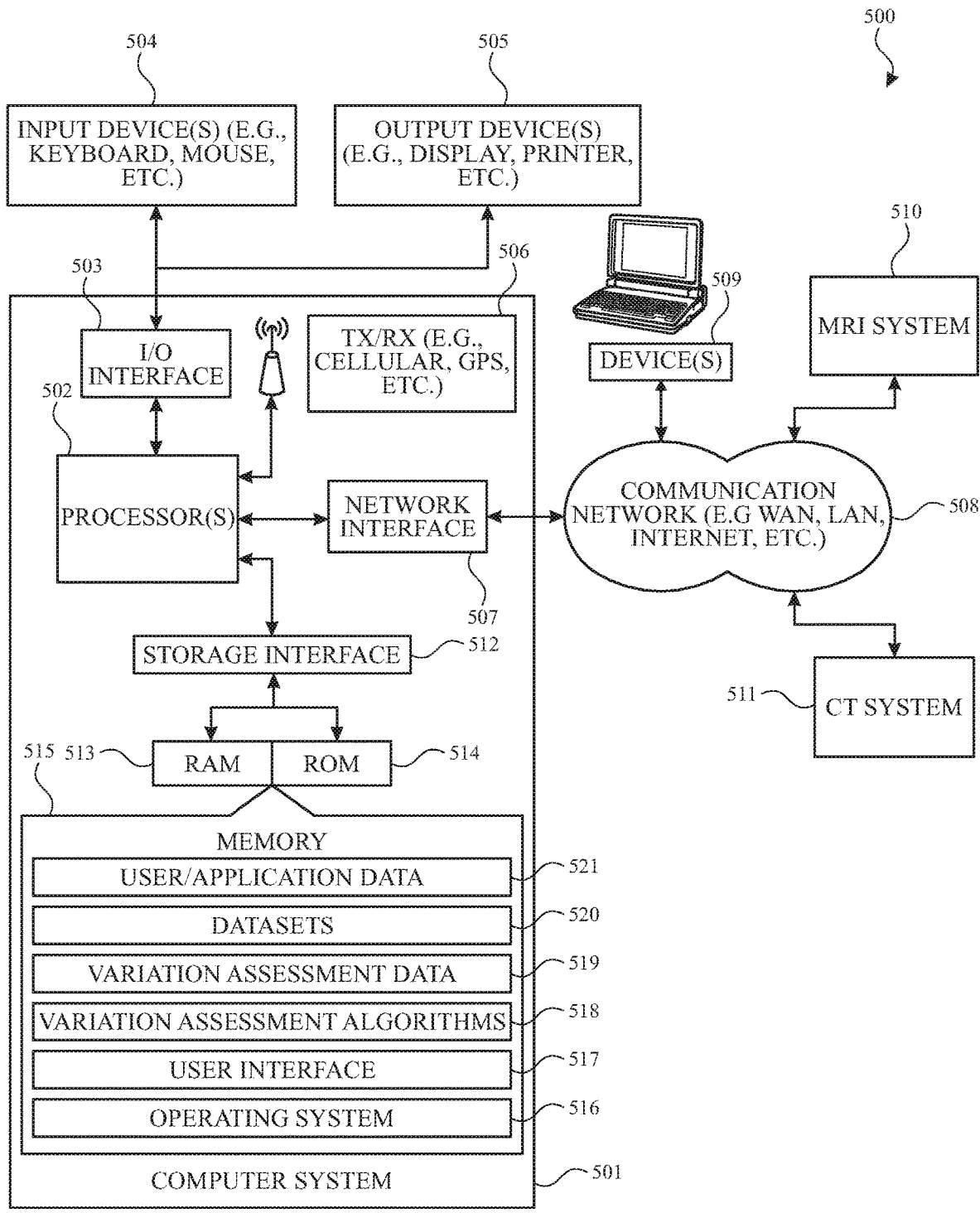
FIG. 5 illustrates an exemplary system for implementing a process for bit prediction as described herein.

FIG. 5 illustrates an exemplary system 500 for bit prediction, consistent with some embodiments of the present disclosure. System 500 may include a computer system 501, input devices 504, output devices 505, devices 509. It is appreciated that one or more components of system 500 can be separate systems or can be integrated systems. In some embodiments, computer system 501 may comprise one or more central processing units ("CPU" or "processor(s)") 502. Processor(s) 502 may comprise at least one data processor for executing program components for executing user- or system-generated requests. A user may include a person, a person using a device such as those included in this disclosure, or such a device itself. The processor may include specialized processing units such as integrated system (bus) controllers, memory management control units, floating point units, graphics processing units, digital signal processing units, etc. The processor may include a microprocessor, such as AMD Athlon, Duron or Opteron, ARM's application, embedded or secure processors, IBM PowerPC, Intel's Core, Itanium, Xeon, Celeron or other line of processors, etc. The processor 502 may be implemented using mainframe, distributed processor, multi-core, parallel, grid, or other architectures. Some embodiments may utilize embedded technologies like application-specific integrated circuits (ASICs), digital signal processors (DSPs), Field Programmable Gate Arrays (FPGAs), etc.

Processor(s) 502 may be disposed in communication with one or more input/output (I/O) devices via I/O interface 503. I/O interface 503 may employ communication protocols/methods such as, without limitation, audio, analog, digital, monoaural, RCA, stereo, IEEE-1394, serial bus, universal serial bus (USB), infrared, PS/2, BNC, coaxial, component, composite, digital visual interface (DVI), high-definition multimedia interface (HDMI), RF antennas, S-Video, VGA, IEEE 802.11 a/b/g/n/x, Bluetooth, cellular (e.g., code-division multiple access (CDMA), high-speed packet access (HSPA+), global system for mobile communications (GSM), long-term evolution (LTE), WiMax, or the like), etc.

Using I/O interface 503, computer system 501 may communicate with one or more I/O devices. For example, input device 504 may be an antenna, keyboard, mouse, joystick, (infrared) remote control, camera, card reader, fax machine, dongle, biometric reader, microphone, touch screen, touchpad, trackball, sensor (e.g., accelerometer, light sensor, GPS, gyroscope, proximity sensor, or the like), stylus, scanner, storage device, transceiver, video device/source, visors, electrical pointing devices, etc. Output device 505 may be a printer, fax machine, video display (e.g., cathode ray tube (CRT), liquid crystal display (LCD), light-emitting diode (LED), plasma, or the like), audio speaker, etc. In some embodiments, a transceiver 506 may be disposed in connection with the processor(s) 502. The transceiver may facilitate various types of wireless transmission or reception. For example, the transceiver may include an antenna operatively connected to a transceiver chip (e.g., Texas Instruments WiLink WL1283, Broadcom BCM4750IUB8, Infineon Technologies X-Gold 618-PMB9800, or the like), providing IEEE 802.11a/b/g/n, Bluetooth, FM, global positioning system (GPS), 2G/3G HSDPA/HSUPA communications, etc.

In some embodiments, processor(s) 502 may be disposed in communication with a communication network 508 via a network interface 507. Network interface 507 may communicate with communication network 508. Network interface 507 may employ connection protocols including, without limitation, direct connect, Ethernet (e.g., twisted pair 10/100/1000 Base T), transmission control protocol/internet protocol (TCP/IP), token ring, IEEE 802.11a/b/g/n/x, etc. Communication network 508 may include, without limitation, a direct interconnection, local area network (LAN), wide area network (WAN), wireless network (e.g., using Wireless Application Protocol), the Internet, etc. Using network interface 507 and communication network 508, computer system 501 may communicate with devices 509. These devices may include, without limitation, personal computer(s), server(s), fax machines, printers, scanners, various mobile devices such as cellular telephones, smartphones (e.g., Apple iPhone, Blackberry, Android-based phones, etc.), tablet computers, eBook readers (Amazon Kindle, Nook, etc.), laptop computers, notebooks, gaming consoles (Microsoft Xbox, Nintendo DS, Sony PlayStation, etc.), or the like. In some embodiments, computer system 501 may itself embody one or more of these devices.

In some embodiments, using network interface 507 and communication network 508, computer system 501 may communicate with Magnet Resonance Imaging (MRI) system 510 and/or and Computed Tomography (CT)511, or any other medical imaging systems. Computer system 501 may communicate with these imaging systems to obtain images for variation assessment. Computer system 501 may also be integrated with these imaging systems.

In some embodiments, processor 502 may be disposed in communication with one or more memory devices (e.g., RAM 513, ROM 514, etc.) via a storage interface 512. The storage interface may connect to memory devices including, without limitation, memory drives, removable disc drives, etc., employing connection protocols such as serial advanced technology attachment (SATA), integrated drive electronics (IDE), IEEE-1394, universal serial bus (USB), fiber channel, small computer systems interface (SCSI), etc. The memory drives may further include a drum, magnetic disc drive, magneto-optical drive, optical drive, redundant array of independent discs (RAID), solid-state memory devices, flash devices, solid-state drives, etc.

The memory devices may store a collection of program or database components, including, without limitation, an operating system 516, user interface application 517, variation assessment algorithms 518, variation assessment data 519, datasets 520, user/application data 521 (e.g., any data variables or data records discussed in this disclosure), etc. Operating system 516 may facilitate resource management and operation of computer system 501. Examples of operating systems include, without limitation, Apple Macintosh OS X, Unix, Unix-like system distributions (e.g., Berkeley Software Distribution (BSD), FreeBSD, NetBSD, OpenBSD, etc.), Linux distributions (e.g., Red Hat, Ubuntu, Kubuntu, etc.), IBM OS/2, Microsoft Windows (XP, Vista/7/8, etc.), Apple iOS, Google Android, Blackberry OS, or the like.

User interface application 517 may facilitate display, execution, interaction, manipulation, or operation of program components through textual or graphical facilities. For example, user interfaces may provide computer interaction interface elements on a display system operatively connected to computer system 501, such as cursors, icons, check boxes, menus, scrollers, windows, widgets, etc. Graphical user interfaces (GUIs) may be employed, including, without limitation, Apple Macintosh operating systems' Aqua, IBM OS/2, Microsoft Windows (e.g., Aero, Metro, etc.), Unix X-Windows, web interface libraries (e.g., ActiveX, Java, Javascript, AJAX, HTML, Adobe Flash, etc.), or the like.

In some embodiments, system 500 may further include Mill system 510 and/or and CT system 511. In some embodiments, computer system 501 may implement one or more variation assessment algorithms 518. Variation assessment algorithms 518 can include, for example, algorithms for determining a probability distribution function (PDF), algorithms for determining a cumulative distribution function (CDF), and algorithms for determining probability variation distribution functions. The PDF, CDF, and probability variation distribution functions are described in more detail below.

In some embodiments, computer system 501 can store variation assessment data 519 and datasets 520 in memory 515. Datasets 520 can include, for example, sets of voxel values associated with multiple evaluations of the first 3D object. Variation assessment data 519 can include, for example, process data generated during the determination of PDFs, CDFs, and probability variation distribution functions.

In some embodiments, computer system 501 may store user/application data 521, such as data and variables as described in this disclosure. Such databases may be implemented as fault-tolerant, relational, scalable, secure databases such as Oracle or Sybase. Alternatively, such databases may be implemented using standardized data structures, such as an array, hash, linked list, struct, structured text file (e.g., XML), table, or as object-oriented databases (e.g., using ObjectStore, Poet, Zope, etc.). Such databases may be consolidated or distributed, sometimes among the various computer systems discussed above in this disclosure. It is to be understood that the structure and operation of any computer or database component may be combined, consolidated, or distributed in any working combination.

Disclosed embodiments describe systems and methods for bit prediction in a bit stream. The illustrated components and steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items.

What is claimed is:

1. A method for data compression using providing a representation of a trie-structure, comprising:
at an electronic device having one or more processors:
receiving a data bit of a bit stream for a data compression optimization procedure using a representation of a trie-structure;
determining a probability of a binary event for each of a plurality of trie-nodes of a trie-structure based on a composition of probabilities of each context of a plurality of contexts of trie, wherein the composition includes a weighted sum of the probabilities based on weighting coefficients;
entropy coding the data bit based on a composite probability in order to tune weighting coefficients to improve compression and a prediction accuracy of a next bit;
adjusting and updating the probability of the binary event for each of the plurality of trie-nodes of the trie-structure, wherein:
adjusting the probability of each context of the plurality of contexts of trie is based on a respective weighted composite probability and a respective adjustment coefficient,
updating the probability of each context of the plurality of contexts of trie is based on the adjusted probability of each context, the probability of the binary event, and a respective update coefficient, and
updating the probability of each trie-node of the plurality of trie-nodes is based on a trie-node probability, the probability of the binary event, and a respective update coefficient; and
determining whether a current trie-node of the trie-structure has a reference to a first context trie-node corresponding to a value of the data bit;
in accordance with a determination that the current trie-node of the trie-structure has the reference to the first context trie-node corresponding to the value of the data bit, assigning the first context trie-node as a new current trie-node;
in accordance with a determination that the current trie-node of the trie-structure does not have the reference to the first context trie-node corresponding to the value of the data bit:
providing a new trie-node of the trie-structure;
assigning a reference of the current trie-node to the new trie-node;
traversing one or more trie-suffix-links associated with the current trie-node to identify a trie-node of the trie-structure having a reference to a second context trie-node corresponding to the value of the data bit;
providing a trie-suffix-link between the new trie-node and the second context trie-node;
copying a probability of the second context trie-node to the new trie-node; and assigning the second context trie-node as the new current trie-node;
predicting the next bit value in the bit stream using the probabilities of the current trie-node of the trie-structure; and
initiating a the data compression optimization procedure, wherein a set of weighting coefficients obtained by the compression optimization procedure is used as a part of a cryptographic key.

2. The method of claim 1, wherein a composition of the weighting coefficients, update coefficients, and adjustment coefficients is optimized by at least one or more greedy optimization techniques.

3. The method of claim 2, wherein the one or more greedy optimization techniques include at least one gradient descent optimization technique.

4. The method of claim 1, wherein the binary event is a binary zero event or a binary one event.

5. The method of claim 1, wherein the trie-structure is used as part of the cryptographic key.

6. A system for data compression using providing a representation of a trie-structure, the system comprising: a one or more processors; and memory having instructions stored thereon, the instructions, when executed by the one or more processors, cause the one or more processors to: receive a data bit of a bit stream for a data compression optimization procedure using a representation of a trie-structure; determine a probability of a binary event for each of a plurality of trie-nodes of a trie-structure based on a composition of probabilities of each context of a plurality of contexts of trie, wherein the composition includes a weighted sum of the probabilities based on weighting coefficients; entropy code the data bit based on a composite probability in order to tune weighting coefficients to improve compression and a prediction accuracy of a next bit; adjust and update the probability of the binary event for each of the plurality of tries-nodes of the trie-structure, wherein: adjusting the probability of each context of the plurality of contexts of trie is based on a respective weighted composite probability and a respective adjustment coefficient, updating the probability of each context of the plurality of contexts of trie is based on the adjusted probability of each context, the probability of the binary event, and a respective update coefficient, and updating the probability of each trie-node of the plurality of trie-nodes is based on a trie-node probability, the probability of the binary event, and a respective update coefficient; determine whether a current trie-node of the trie-structure has a reference to a first context trie-node corresponding to a value of the data bit; in accordance with a determination that the current trie-node of the trie-structure has the reference to the first context trie-node corresponding to the value of the data bit, assign the first context trie-node as a new current trie-node; in accordance with a determination that the current trie-node of the trie-structure does not have the reference to the first context trie-node corresponding to the value of the data bit: provide a new trie-node of the trie-structure; assign a reference of the current trie-node to the new trie-node; traverse one or more trie-suffix-links associated with the current trie-node to identify a trie-node of the trie-structure having a reference to a second context trie-node corresponding to the value of the data bit; provide a trie-suffix-link between the new trie-node and the second context trie-node; copy a probability of the second context trie-node to the new trie-node; and assign the second context trie-node as the new current trie-node; and predicting the next bit value in the bit stream using the probabilities of the current trie-node of the trie-structure; and initiating the data a compression optimization procedure, wherein a set of weighting coefficients obtained by the compression optimization procedure is used as a part of a cryptographic key.

7. The system of claim 6, wherein determining a probability of a binary event for each of a plurality of trie-nodes of a trie-structure comprises:
determining the probability of the binary event based on a composition of probabilities of each context of a plurality of contexts of trie, wherein the composition includes a weighted sum of the probabilities based on weighting coefficients.

8. The system of claim 6, wherein a composition of the weighting coefficients, update coefficients, and adjustment coefficients is optimized by at least one or more greedy optimization techniques.

9. The system of claim 8, wherein the one or more greedy optimization techniques include at least one gradient descent optimization technique.

10. The system of claim 6, wherein the binary event is a binary zero event or a binary one event.

11. A non-transitory computer-readable medium having instructions stored thereon for data compression using a representation of a trie-structure, the instructions, when executed by one or more processors, cause the one or more processors to: receive a data bit of a bit stream for data compression optimization procedure using a representation of a trie-structure; determine a probability of a binary event for each of a plurality of trie-nodes of a trie-structure based on a composition of probabilities of each context of a plurality of contexts of trie, wherein the composition includes a weighted sum of the probabilities based on weighting coefficients; entropy code the data bit based on a composite probability in order to tune weighting coefficients to improve compression and a prediction accuracy of a next bit; adjust and update the probability of the binary event for each of the plurality of trie-nodes of the trie-structure, wherein:
adjusting the probability of each context of the plurality of contexts of trie is based on a respective weighted composite probability and a respective adjustment coefficient, updating the probability of each context of the plurality of contexts of trie is based on the adjusted probability of each context, the probability of the binary event, and a respective update coefficient, and updating the probability of each trie-node of the plurality of trie-nodes is based on a trie-node probability, the probability of the binary event, and a respective update coefficient; determine whether a current trie-node of the trie-structure has a reference to a first context trie-node corresponding to a value of the data bit; in accordance with a determination that the current trie-node of the trie-structure has the reference to the first context trie-node corresponding to the value of the data bit, assign the first context trie-node as a new current trie-node; in accordance with a determination that the current trie-node of the trie-structure does not have the reference to the first context trie-node corresponding to the value of the data bit: provide a new trie-node of the trie-structure; assign a reference of the current trie-node to the new trie-node; traverse one or more trie-suffix-links associated with the current trie-node to identify a trie-node of the trie-structure having a reference to a second context trie-node corresponding to the value of the data bit;
provide a trie-suffix-link between the new trie-node and the second context trie-node; copy a probability of the second context trie-node to the new trie-node; and assign the second context trie-node as the new current trie-node; predicting the next bit value in the bit stream using the probabilities of the current trie-node of the trie-structure; and initiating the data a compression optimization procedure, wherein a set of weighting coefficients obtained by the compression optimization procedure is used as a part of a cryptographic key.

12. The computer-readable medium of claim 11, wherein determining a probability of a binary event for each of a plurality of trie-nodes of a trie-structure comprises:
determining the probability of the binary event based on a composition of probabilities of each context of a plurality of contexts of trie, wherein the composition includes a weighted sum of the probabilities based on weighting coefficients.

13. The computer-readable medium of claim 11, wherein a composition of the weighting coefficients, update coefficients, and adjustment coefficients is optimized by at least one or more greedy optimization techniques.

14. The computer-readable medium of claim 13, wherein the one or more greedy optimization techniques include at least one gradient descent optimization technique.

* * * * *